US008653509B2

(12) United States Patent
Popp

(10) Patent No.: US 8,653,509 B2
(45) Date of Patent: Feb. 18, 2014

(54) OPTOELECTRONIC COMPONENT

(75) Inventor: Michael Popp, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 633 days.

(21) Appl. No.: 12/921,313

(22) PCT Filed: Mar. 5, 2009

(86) PCT No.: PCT/DE2009/000313
§ 371 (c)(1),
(2), (4) Date: Dec. 20, 2010

(87) PCT Pub. No.: WO2009/109183
PCT Pub. Date: Sep. 11, 2009

(65) Prior Publication Data
US 2013/0187186 A1    Jul. 25, 2013

(30) Foreign Application Priority Data
Mar. 7, 2008    (DE) .......................... 10 2008 013 031

(51) Int. Cl.
*H01L 27/15* (2006.01)
(52) U.S. Cl.
USPC ............................................. 257/40; 257/79
(58) Field of Classification Search
USPC ..................................... 257/79, 40
See application file for complete search history.

(56) References Cited

U.S. PATENT DOCUMENTS 4,054,814 A    10/1977   Fegley et al.
6,791,114 B2 *  9/2004   Shen ................................. 257/79
2003/0010985 A1* 1/2003   Shen ................................. 257/79
2003/0155151 A1  8/2003  Hermanns et al.
2004/0095300 A1  5/2004  So et al.
2005/0174064 A1  8/2005  Agostinelli et al.
2006/0066223 A1  3/2006  Pschenitzka

FOREIGN PATENT DOCUMENTS

| DE | 26 48 979 | 5/1977 |
| EP | 1 460 884 | 9/2004 |
| JP | 2001-523042 | 11/2001 |
| JP | 2004-152518 | 5/2004 |
| JP | 2004-296154 | 10/2004 |
| JP | 2007-005257 | 1/2007 |
| JP | 2007-207569 | 8/2007 |
| JP | 2007-523368 | 8/2007 |
| WO | WO 99/27554 | 6/1999 |
| WO | WO 01/56000 | 8/2001 |
| WO | WO 2005/078691 | 8/2005 |

* cited by examiner

*Primary Examiner* — Howard Weiss
*Assistant Examiner* — Steven Rao
(74) *Attorney, Agent, or Firm* — Cozen O'Connor

(57) ABSTRACT

An optoelectronic component with short circuit protection is provided, comprising a first electrode layer (1) with a plurality of segments (11, 12), which are arranged separately from one another, a functional layer (2) on the first electrode layer (1), which emits electromagnetic radiation when in operation, a second electrode layer (3) on the functional layer (2), a power supply (4) and a plurality of electrical connections (51, 52). In each case at least one of the plurality of electrical connections (51, 52) is arranged between the first power supply (4) and at least one of the plurality of segments (11, 12) of the first electrode layer (1) for electrical contacting of the first electrode layer (1). The power supply (4) has a first cross-section and each of the plurality of electrical connections (51, 52) has a second cross-section. The second cross-section is smaller than the first cross-section, and the electrical connections (51, 52) take the form of fuses.

15 Claims, 9 Drawing Sheets

OPTOELECTRONIC COMPONENT

RELATED APPLICATIONS

This is a U.S. national stage of application No. PCT/DE2009/000313, filed on Mar. 5, 2009.

This application claims the priority of German application no. 10 2008 013 031.1 filed Mar. 7, 2008, the entire content of which is hereby incorporated by reference.

FIELD OF THE INVENTION

The invention relates to an optoelectronic component with a functional layer.

BACKGROUND OF THE INVENTION

Publication WO 99/27554 describes a semiconductor component.

The efficiency and service life of optoelectronic components, such as for example light-emitting diodes, infrared-emitting light-emitting diodes, organic light-emitting diodes (OLEDs), organic solar cells or organic photodetectors with functional layers may be greatly reduced by the occurrence of a short circuit.

SUMMARY OF THE INVENTION

One object of the invention is to provide an optoelectronic component with a power supply to the functional layers which includes short circuit protection.

According to one embodiment, an optoelectronic component with short circuit protection comprises a first electrode layer with a plurality of segments, which are arranged separately from one another, a functional layer on the first electrode layer, which emits electromagnetic radiation when in operation, a second electrode layer on the functional layer, a power supply and a plurality of electrical connections, wherein in each case at least one of the plurality of electrical connections is arranged between the first power supply and at least one of the plurality of segments of the first electrode layer for electrical contacting of the first electrode layer, the power supply has a first cross-section and each of the plurality of electrical connections has a second cross-section, the second cross-section is smaller than the first cross-section, and the plurality of electrical connections take the form of fuses.

The statement that a first layer is arranged or applied "on" or "over" a second layer may here and hereinafter mean that the first layer is arranged or applied directly in direct mechanical and/or electrical contact on the second layer. It may moreover also mean that the first layer is arranged or applied indirectly on or over the second layer. In this case, further layers may then be arranged or applied between the first layer and the second layer.

The terms "electromagnetic radiation", "radiation" or "light" may here and hereinafter mean electromagnetic radiation with at least one wavelength or one spectral component in an infrared to ultraviolet wavelength range. Infrared, visible and/or ultraviolet electromagnetic radiation may in particular be meant here.

"Plurality" may here and hereinafter denote a number, for instance of connections or segments, which is greater than or equal to two.

The optoelectronic component described herein comprises short circuit protection and may, in comparison with known optoelectronic components with short circuit protection, largely prevent failure of the optoelectronic component as the result of a short circuit.

In this case, failure of an optoelectronic component as the result of a short circuit may largely be prevented in that at least in each case one of the electrical connections is arranged between the power supply and at least one of the plurality of segments of the first electrode layer. Each individual electrical connection here takes the form of a fuse, such that it may blow in the case of a short circuit.

In particular, each of the at least one of the plurality of electrical connections which is arranged between one segment of the first electrode layer and the power supply is connected electrically conductively with the segment and the power supply. When the optoelectronic component is operating normally, current paths may be formed by the power supply, each of the plurality of electrical connections and by the segments of the first electrode layer assigned in each case to the electrical connections.

The first cross-section and the second cross-section here denote the respective cross-sectional areas of the power supply and the plurality of the electrical connections perpendicular to the current paths when the optoelectronic component is operating normally.

In conventional optoelectronic components short circuits may occur as a result of undefined particle contamination or "pin-holes", such as for instance microchannels, which prevent the emission of radiation by the optoelectronic component or at least severely reduce its efficiency. If a short circuit takes place in an optoelectronic component between two electrically conductive parts, for example between two electrodes, the majority of the electrical power supplied is dissipated as power loss by way of the short circuit virtually without resistance. As a result of the severely reduced ohmic resistance, a high current, which generally amounts to a multiple of the operating current, may flow through the short circuit connection while the voltage is at the same time severely reduced.

Since the probability of a short circuit increases greatly with a relatively large area of the optoelectronic component, the occurrence of short circuits in conventional components may prevent the transition to larger area components. Because the first electrode layer comprises a plurality of mutually separately arranged segments, large-area operation of the optoelectronic component described herein is possible, for example as a large-area lighting device such as for instance a lighting tile, wherein the component is distinguished by an increased service life and improved efficiency.

Moreover, the segmented arrangement of the first electrode layer in conjunction with the meltable electrical connections allows local restriction of the short circuit to the segment in each case affected by the short circuit. If a short circuit occurs between a segment of the first electrode layer and the second electrode layer, the at least one electrical connection arranged between the segment and the power supply may melt as a result of the high current caused by the short circuit. Melting of the electrical connection merely causes the defective segment of the first electrode layer to be isolated from the active circuit. The resistance of the electrical connection between the corresponding segment and the power supply is infinitely large, while segments assigned to intact electrical connections continue to remain ready for operation. In addition, defects, such as for example non-emitting areas, for instance "dark spots" or "black spots", and the degrading influence of "pin-holes" may be prevented from spreading beyond the segment affected by the short circuit.

Furthermore, the meltable electrical connections of the optoelectronic component have a reduced cross-section relative to the power supply in comparison with conventional optoelectronic components. The cross-section reduced relative to the power supply additionally promotes melting of the electrical connection.

The second cross-section of the plurality of electrical connections may be identical for all the plurality of electrical connections. Alternatively, the second cross-section of at least two of the plurality of electrical connections or indeed of all the plurality of electrical connections may be different. However the cross-section of all the plurality of electrical connections is here smaller than the first cross-section of the power supply.

Furthermore, the second cross-section may be reduced at least by a factor of 10 in comparison with the first cross-section. This may mean in particular that the second cross-section of each of the plurality of electrical connections may be reduced in comparison with the power supply at least by a factor of 10. Furthermore, the cross-section of each of the plurality of electrical connections may preferably be reduced at least by a factor of 100, more preferably by at least a factor of 500 and particularly preferably by at least a factor of 1000. The smaller is the second cross-section in comparison with the first cross-section, the more rapidly an electrical connection may melt in the case of a short circuit.

Furthermore a larger second cross-section may result in lower electrical resistance of an electrical connection. Depending on the embodiment of the electrical connections, the second cross-section may therefore be smaller by a factor of 10 to 100 or by a factor of 100 to 500 or by a factor of 500 to 1000 than the first cross-section, the limit values in each case being included.

Advantageously each of the electrical connections may take the form of a constriction or at least comprise a constriction, wherein the constriction may here extend over the entire extent of the electrical connection along a current path in normal operation or over just part of the electrical connection. If the electrical connection is embodied as a constriction or with a constriction, melting of the electrical connection may be given an extra boost in the case of a short circuit, since a comparatively higher current density is present in the region of the constriction as a result of the reduced second cross-section than in the power supply and optionally in the remainder of the electrical connection.

The first cross-section of the power supply is here dimensioned in accordance with the number of electrical connections to be contacted. In particular, the first cross-section of the power supply is dimensioned such that the cross-section is sufficient to supply the first electrode layer via at least in each case one of the electrical connections. The power supply here comprises a preferred first cross-section of from 10 $\mu m^2$ to 1000 $\mu m^2$, more preferably of from 25 $\mu m^2$ to 750 $\mu m^2$ and particularly preferably of from 50 $\mu m^2$ to 500 $\mu m^2$, the limit values in each case being included.

Furthermore, the power supply and the plurality of electrical connections are of one-piece construction. This may mean that the power supply and the plurality of electrical connections may be of continuous and/or one-part construction. One-piece construction of the power supply and the plurality of electrical connections may allow application of the power supply and the plurality of electrical connections in one process step.

According to a further embodiment, the plurality of electrical connections and the power supply are made from different materials.

Furthermore, the plurality of electrical connections may for example be made of conductive materials, which may be selected from Ag, Cu, Zn, Sn or from an alloy or from a mixture of these in variable percentage ratios.

If the plurality of electrical connections and the power supply are made from different materials, this may mean that the plurality of electrical connections and the power supply are not of one-piece, continuous or one-part construction. However, this construction may make it possible for the plurality of electrical connections to contain a material which has a lower melting point than the power supply and thus to promote melting of the electrical connection in the case of a short circuit.

The plurality of electrical connections may furthermore have a melting point of between greater than or equal to 150° C. and less than or equal to 1100° C. Preferably, conductive materials may here be selected for the plurality of electrical connections which have a melting point of between 800° C. and 1500° C., between 250° C. and 800° C. and particularly preferably between 100° C. and 250° C., the limit values in each case being included. It may here be advantageous to use for the plurality of electrical connections not only the above-stated materials with a comparatively high melting point but also materials, such as for example indium or aluminium, which have a comparatively low melting point. The comparatively low melting point of indium or aluminium may make it easier for the plurality of electrical connections to melt in the case of a short circuit.

According to a further embodiment, the optoelectronic component comprises a substrate, on which the plurality of segments of the first electrode layer, the functional layer and the second electrode layer are arranged. The substrate may here be transparent or translucent, flexible or inflexible and comprises for example a glass, quartz, silicone, plastics or ceramic or a printed circuit board or a combination thereof. Examples of plastics materials are polyester carbonate, polyether sulfonate, polyethylene naphthalate, polyethylene terephthalate and polyimide.

Furthermore, the substrate may be formed such that it comprises two main surfaces and two side faces, wherein the main surfaces are larger than the side faces. Therefore, the main surfaces may be particularly suitable for the arrangement of segments and further layers of the optoelectronic component.

In a further embodiment, the power supply, the plurality of electrical connections and the plurality of segments of the first electrode layer may be arranged on one, i.e. the same, main surface of the substrate. This may mean that the power supply, the plurality of electrical connections and the plurality of segments of the first electrode layer are arranged adjacent one another. An adjacent arrangement of the power supply, the plurality of electrical connections and the plurality of segments of the first electrode layer may here and hereinafter mean that the power supply and the plurality of electrical connections and/or the plurality of electrical connections and the plurality of segments of the first electrode layer may be arranged in direct contact with one another, such that the power supply, the plurality of electrical connections and the plurality of segments of the first electrode layer in each case directly adjoin one another.

Furthermore, indirect contact may also be provided, in which case further segments and/or layers are arranged between the power supply and the plurality of electrical connections and/or the plurality of electrical connections and the plurality of segments of the first electrode layer.

According to a further embodiment, the power supply and the plurality of segments of the first electrode layer may be arranged on different main surfaces of the substrate. This may mean that, for example, the power supply is arranged on a first main surface of the substrate and the plurality of segments of the first electrode layer are arranged on a second main surface of the substrate. For electrical contacting of the plurality of segments of the first electrode layer by at least in each case one of the electrical connections, it may therefore be necessary for the plurality of electrical connections to be formed in the substrate and to extend through the substrate.

To this end, a plurality of orifices may be formed in the substrate, in a preferably regular arrangement, in which orifices in each case one of the plurality of electrical connections may be arranged. These orifices may comprise regularly or irregularly shaped cross-sections. In a regular embodiment, the orifices may for example comprise polygonal, circular or elliptical cross-sections. In this case, the orifices are identical to or different from one another and may furthermore for example also comprise cross-sections which develop from one of the stated shapes into another.

Furthermore, the optoelectronic component may comprise a cavity, which is arranged in the substrate adjacent to at least one of the plurality of electrical connections. The cavity is particularly suited, in the case of a short circuit, to receiving melting material from the at least one of the plurality of electrical connections. To this end, the cavity may for example take the form of a recess in the substrate, over which the electrical connection is arranged. In this way, the cavity may serve as a reservoir for the melting material of the at least one of the plurality of electrical connections.

Furthermore, the substrate may comprise a plurality of cavities, wherein each of the plurality of electrical connections may be arranged over one of the plurality of cavities. Furthermore, the substrate may comprise a continuous cavity, above which at least two of the plurality of electrical connections or all of them are arranged.

According to a further embodiment, the optoelectronic component may comprise an insulator layer on at least one of the plurality of electrical connections. In this case, the at least one of the plurality of electrical connections may be constructed such that the at least one of the plurality of electrical connections melts in the event of a short circuit and that the insulator layer is suitable for insulating the in each case one of the plurality of electrical connections. In this case, the insulator layer may take the form of a dielectric with a meltable and/or flowable material, such as for example

- a photoresist,
- a thermoplastic material, which may for example be selected from acrylonitrile-butadiene-styrene (ABS), polyamides (PA), polycarbonate (PC), polyethylene (PE), polypropylene (PP), polystyrene (PS), polyvinyl chloride (PVC) or from celluloid-containing plastics,
- polyimides,
- metal and/or semi-metal oxides,
- metal and/or semi-metal nitrides,
- metal and/or semi-metal oxynitrides, such as for example silicon oxide or silicon nitride and thus be suited to insulating the in each case one of the plurality of electrical connections.

In the case of a short circuit, the in each case one of the electrical connections, together with the insulator layer, which surrounds the electrical connection, may therefore on the one hand be meltable. According to a preferred arrangement the cavity is here in each case arranged adjacent to the in each case one electrical connection, such that the melting material of the electrical connection may be collected in the cavity. The insulator layer arranged on the in each case one electrical connection may, as a consequence of the short circuit, likewise be meltable or pourable, such that the melting or pouring insulator material may initially be arranged in the region of the melting electrical connection and then likewise be collected by the cavity. In this case, the material of the in each case one electrical connection may be thoroughly mixed with the insulator material. Preferably, however, the insulator material will be present in a quantitative excess relative to the in each case one electrical connection, such that, after the thorough mixing of the two materials, increased saturation of the material of the electrical connection may arise as a result of the continued flow or trickling of insulator material into the cavity. In the course of the progressive saturation, the insulator material may overlay the material of the in each case one electrical connection, whereby the insulating effect of the insulator layer may occur relative to the in each case one electrical connection.

Furthermore, the functional layer may comprise at least two segments, which are arranged separately from one another, wherein in each case one segment of the functional layer is arranged on at least one of the plurality of segments of the first electrode layer. This may mean, for example, that the at least two segments of the functional layer are also separately contactable electrically by at least one of the plurality of segments of the first electrode layer.

Furthermore, this may mean that the mutually separate segments of the functional layer may be operated at the same time. In this case, at least two segments of the functional layer may emit light of at least two different spectra, such that white light is obtained as a result of superimposition of the spectra.

In this case, the functional layer or each segment of the functional layer may comprise a multilayer stack of functional layers with at least one light-emitting layer.

Furthermore, the functional layer or each segment of the functional layer may for example comprise at least one or more layers selected from n- and p-conductive layers, for instance electron injection layers, electron transport layers, hole blocking layers, electron blocking layers, hole transport layers and hole injection layers.

The light-emitting layer may for example comprise a conventional pn-junction, a double heterostructure, a single quantum well structure (SQW structure) or a multiple quantum well structure (MQW structure), a luminescent or fluorescent material, wherein the electroluminescence is generated by the recombination of electrons and holes in the light-emitting layer.

The functional layer may comprise organic and/or inorganic materials.

An organic material may comprise organic polymers or small organic molecules. Preferably, organic polymers comprise fully or partially conjugated polymers.

Suitable organic polymer materials comprise at least one of the following materials in every possible combination: poly (p-phenylene vinylene) (PPV), poly(2-methoxy-5(2-ethyl) hexyloxyphenylene vinylene) (MEH-PPV), at least one PPV derivative (for example dialkoxy or dialkyl derivatives) polyfluorenes and/or copolymers comprising polyfluorene segments, PPVs and related copolymers, poly(2,7-(9,9-di-N-octylfluorene)-(1,4-phenylene-((4-secbutylphenyl)imino)-1,4-phenylene) (TFB), poly(2,7-(9,9-di-N-octylfluorene)-(1,4-phenylene-((4-methylphenyl)imino)-1,4-phenylene-((4-methylphenyl)imino)-1,4-phenylene) (PFM), poly(2,7-(9,9-di-N-octylfluorene)-(1,4-phenylene-((4-methoxyphenyl) imino)-1,4-phenylene) (PFMO), poly(2,7-(9,9-di-N- octylfluorene) (F8), poly(2,7(9,9-di-N-octylfluorene)-3,6-benzothiadiazole)(F8BT), or poly(9,9-dioctylfluorene).

As an alternative to polymers, small organic molecules may also be used in the organic functional layer. Examples of such small molecules are, for example: aluminium-tris(8-hydroxyquinoline)(Alq$_3$), aluminium-1,3-bis(N,N-dimethylaminophenyl)-1,3,4-oxidazole (OXD-8), aluminium-oxo-bis(2-methyl-8-quinoline), aluminium-bis(2-methyl-8-hydroxyquinoline), beryllium-bis(hydroxybenzo-quinoline) (BEQ.Sub.2), bis(diphenylvinyl)biphenylene (DPVBI) and arylamine-substituted distyrylarylene (DSA amines). Moreover, the functional layer may contain inorganic materials such as for example III-V compound semiconductors such as materials based on nitride and/or phosphide compound semiconductors.

In the present context, "based on nitride compound semiconductors" means that the functional layer comprises a nitride III-V compound semiconductor material, preferably $Al_nGa_mIn_{1-n-m}N$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

In the present context, "based on phosphide compound semiconductors" means that the functional layer comprises a phosphide III-V compound semiconductor material, preferably $Al_nGa_mIn_{1-n-m}P$, wherein $0 \leq n \leq 1$, $0 \leq m \leq 1$ and $n+m \leq 1$.

Furthermore, the functional layer may additionally or alternatively also comprise a semiconductor material based on AlGaAs or a II-VI compound semiconductor material.

According to a further embodiment, the functional layer may also be arranged continuously over at least two of the plurality of segments of the first electrode layer. This allows large-area and therefore inexpensive application of the functional layer.

Furthermore, the at least two of the plurality of segments of the first electrode layer may be connected parallel to one another. In contrast to series connection of the segments of the first electrode layer, such a parallel connection of at least two of the plurality of segments of the first electrode layer allows the addition of further individual segments or indeed the taking out of service thereof, for example as the result of a short circuit, without the functionality of the further segments of the first electrode layer being affected.

According to a further embodiment, the optoelectronic component may furthermore comprise a current spreading layer, which is arranged between at least one of the plurality of electrical connections and at least one of the plurality of segments of the first electrode layer. Such a current spreading layer may for example be widened adjacent the electrical connection for the purpose of spreading current and for example comprise a transparent, conductive oxide (TCO) or consist of such.

Transparent conductive oxides may comprise metal oxides, such as for example zinc oxide, tin oxide, cadmium oxide, titanium oxide, indium oxide or indium tin oxide (ITO). In addition to binary metal-oxygen compounds, such as for example $ZnO$, $SnO_2$ or $In_2O_3$, the group of TCOs also includes ternary metal-oxygen compounds, such as for example $Zn_2SnO_4$, $CdSnO_3$, $ZnSnO_3$, transparent conductive oxides. Furthermore, TCOs do not necessarily correspond to a stoichiometric composition and may also be p- or n-doped.

Furthermore, the second electrode layer may comprise at least two segments and in each case one of the at least two segments may be arranged over at least one of the plurality of segments of the first electrode layer. This may mean that the second electrode layer is arranged with one of the at least two segments over at least two segments of the first electrode layer.

Alternatively, it is possible according to a further embodiment for the second electrode layer to be arranged continuously over at least two of the plurality of segments of the first electrode layer. This may mean that the second electrode layer may also advantageously be applied extensively over a plurality of the segments of the first electrode layer.

In this case, the optoelectronic component may take the form of a light-emitting component, for instance light-emitting diode, infrared-emitting light-emitting diode, organic light-emitting diode (OLED), organic solar cell or organic photodetector, with a light-emitting functional layer in the form of a "top emitter" and/or of a "bottom emitter".

In the top emitter configuration the second electrode layer may advantageously display transparency or at least translucency for at least part of the electromagnetic radiation.

Moreover, the second electrode layer may, in a top emitter configuration, comprise a light-scattering layer or a scattering film, which may for example take the form of a polymer film. Furthermore, scattering particles may be admixed with the scattering film or the light-scattering layer. In particular, the scattering particles may comprise for example a metal oxide, for instance titanium oxide or aluminium oxide, such as for instance corundum, and/or glass particles. The scattering particles may here have diameters or grain sizes of less than 1 μm up to an order of magnitude of 10 μm or even up to 100 μm.

Alternatively and/or in addition, in a bottom emitter configuration the light-scattering layer or the scattering film may also be applied to a transparent substrate.

In the bottom emitter configuration the first electrode may advantageously also exhibit transparency or at least translucency for at least part of the electromagnetic radiation.

A transparent first electrode layer, which may take the form of an anode and thus serves as a hole-injecting material with a work function greater than 4.5 eV, may for example comprise a transparent conductive oxide, as already described above, or consist of a transparent conductive oxide. Alternatively and/or in addition, other anode materials are also conceivable, such as for example metals such as platinum, gold, palladium or indium,
metal oxides such as lead oxide, tin oxide or indium tin oxide (ITO),
graphite,
doped inorganic semiconductors such as silicon, germanium or gallium arsenide and
doped conductive polymers such as polyanilines, polypyrroles or polythiophenes).

In an alternative configuration the first electrode layer may also take the form of a cathode.

A transparent second electrode layer, which may take the form of a cathode and thus of an electron injection layer with a comparatively low work function, may for example take the form of a multilayer structure, comprising a charge injection layer and a conductive layer. The charge injection layer may contain calcium or barium or mixtures thereof, while the conductive layer may contain aluminium, silver, magnesium, gold, copper or a mixture thereof. In an alternative configuration the second electrode layer may also take the form of an anode.

DETAILED DESCRIPTION OF THE DRAWINGS

Figure 1A:
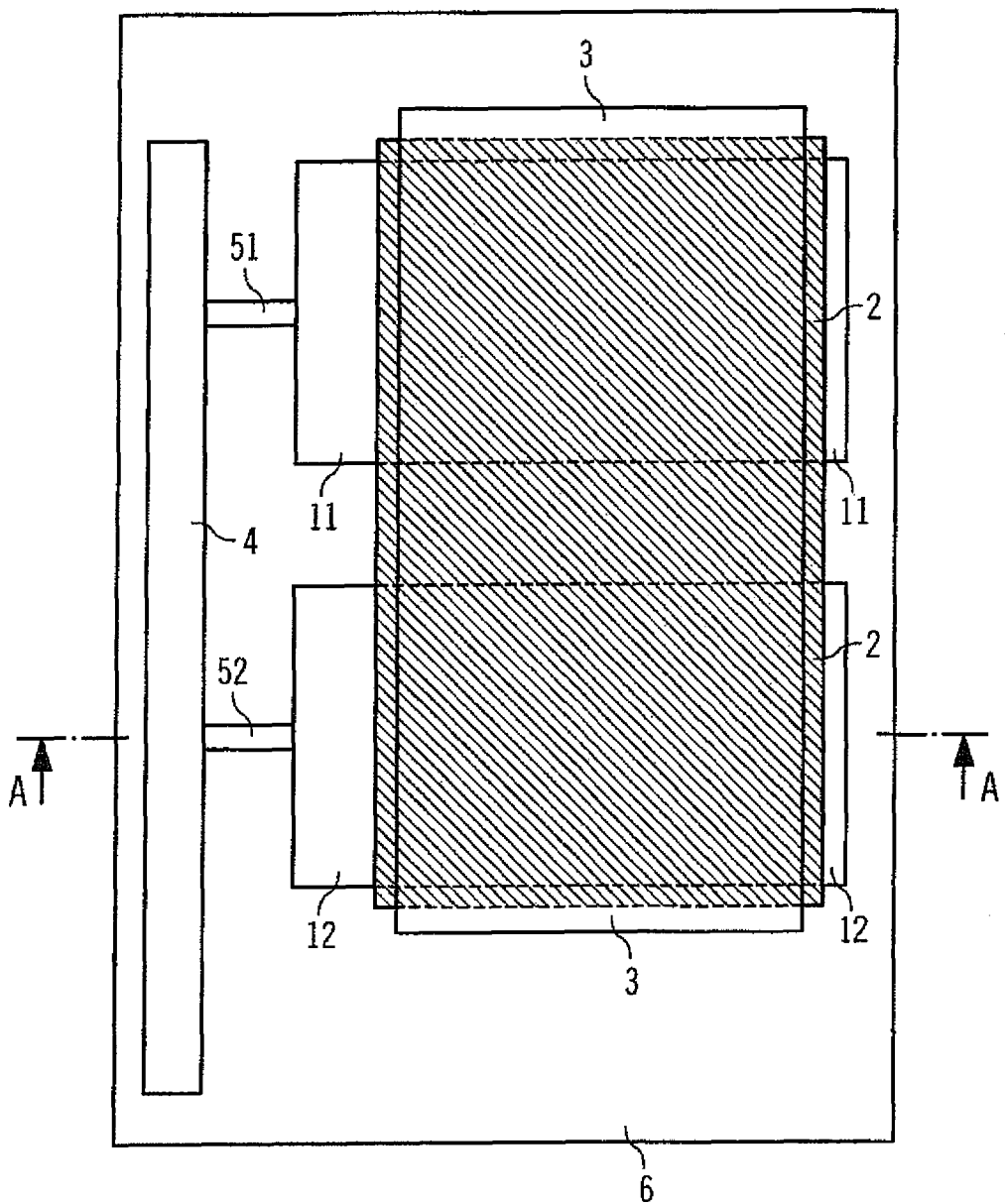
FIGS. 1A and 1B are schematic representations of an optoelectronic component according to one exemplary embodiment in plan view (FIG. 1A) and in sectional representation (FIG. 1B)
Figure 1B:
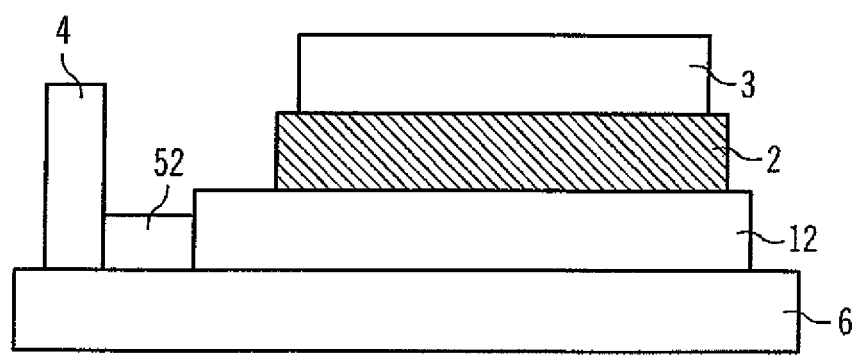

FIG. 1A shows a schematic representation, in plan view, of an optoelectronic component according to one exemplary embodiment. FIG. 1B shows a schematic sectional representation of the optoelectronic component in the section plane labelled AA in FIG. 1A. FIGS. 1A and 1B and all the further Figures show the optoelectronic component in a construction with one organic functional layer. The optoelectronic component described in FIGS. 1A to 7 may however also be constructed with one or more functional layers, which additionally or alternatively contain inorganic materials, such as for example III-V compound semiconductors.

According to FIG. 1A the optoelectronic component comprises a substrate 6 with a first electrode layer 1 with two segments 11, 12, which are arranged separately from one another on a main surface of the substrate 6. Arranged on the respective segment 11, 12 of the first electrode layer 1 is an organic functional layer 2, which emits electromagnetic radiation when in operation. Furthermore, a second electrode layer 3 is arranged on the organic functional layer 2. The organic functional layer 2 and the second electrode layer 3 are in each case arranged continuously over the two segments 11, 12 of the first electrode layer 1, wherein the segments 11, 12 and the layers 2, 3 are shown in FIG. 1A as not overlapping, so as to show the arrangement clearly.

In this case, the two segments 11, 12 of the first electrode layer 1 are connected parallel to one another and each of the segments 11, 12 of the first electrode layer 1 is connected to a power supply 4 in each case by an electrical connection 51, 52. Furthermore, as an alternative to the exemplary embodiment shown, the segment 11 and/or the segment 12 may be connected electrically conductively to the power supply 4 by more than one electrical connection 51 or 52 respectively.

The power supply 4 has a first cross-section. Furthermore, the electrical connections 51, 52 in each case take the form of fuses and in each case have a second cross-section, which is reduced relative to the first cross-section of the power supply 4. If, for example, a short circuit is present between the segment 11 of the first electrode layer 1 and the second electrode layer 3, the electrical connection 51 contacting the segment 11 may melt. Melting of the electrical connection 51 is promoted by the reduced second cross-section of the electrical connections 51.

The electrical connections 51, 52 and the power supply 4 may on the one hand be of one-piece construction or alternatively, as illustrated in FIG. 1B, may be made of two adjacently arranged electrically conductive elements. If the power supply 4 and the electrical connections 51, 52 are not of one-piece construction, it is possible for the electrical connections 51, 52 and the power supply 4 to be made of different materials.

In this case, materials such as those described in the general part, with a melting point of between greater than or equal to 150° C. and less than or equal to 1100° C., may be selected for the electrical connections 51, 52. To form the electrical connections 51, 52, materials are here preferred, such as for example indium or aluminium, which have a lower melting point than the further materials described in the general part, in order to make melting of the electrical connections 51, 52 easier in the case of a short circuit.

Figure 2:
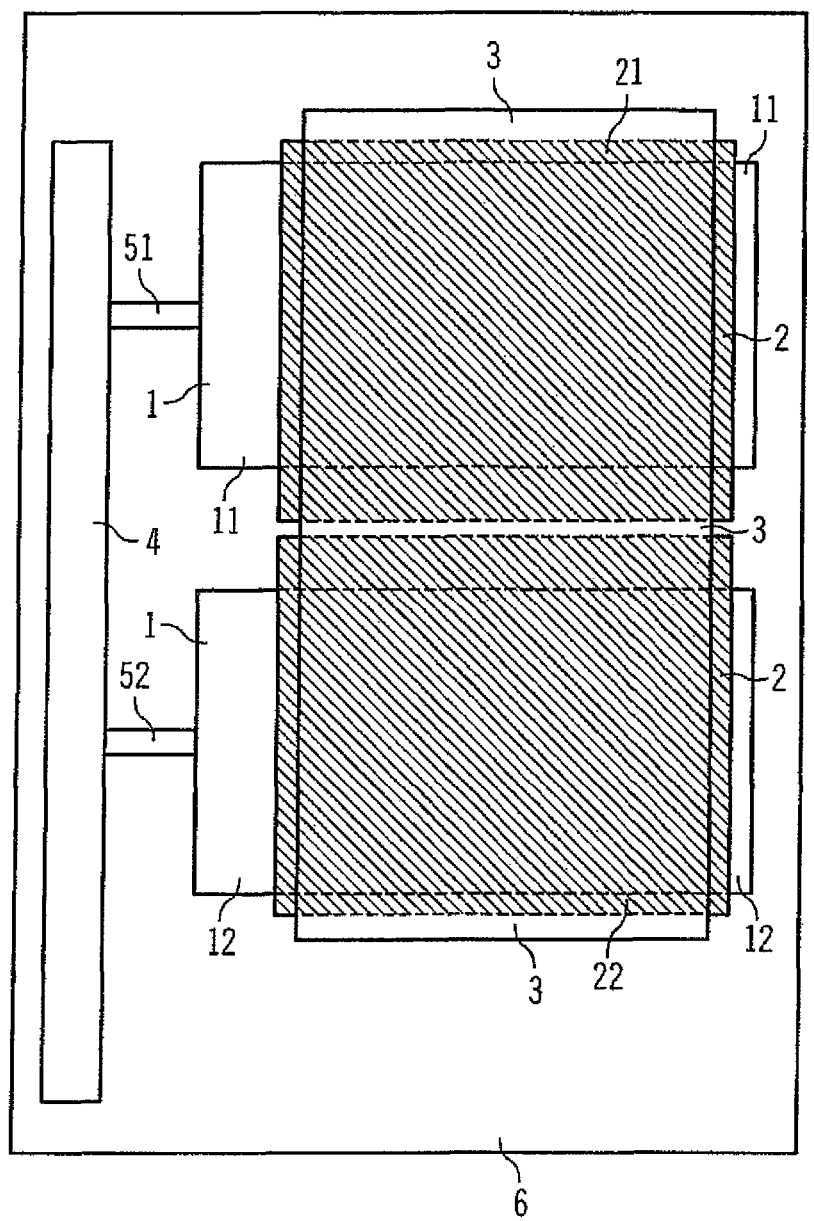
FIG. 2 is a schematic sectional representation of an optoelectronic component according to a further exemplary embodiment.

FIG. 2 is a schematic sectional representation of an optoelectronic component according to a further exemplary embodiment with an organic functional layer 2 comprising two segments 21, 22. In this case, the two segments 21, 22 of the organic functional layer 2 are arranged separately from one another, wherein in each case one segment 21, 22 of the organic functional layer 2 is arranged on in each case one segment 11, 12 of the first electrode layer 1.

The second electrode layer 3 is arranged, as illustrated in FIG. 2, continuously over two segments 11, 12 of the first electrode layer 1. Alternatively, the second electrode layer 3 may also comprise at least two segments 31, 32, wherein in each case one of the segments of the second electrode layer 3 is arranged in each case on one segment 11, 12 of the first electrode layer 1.

Figure 3:
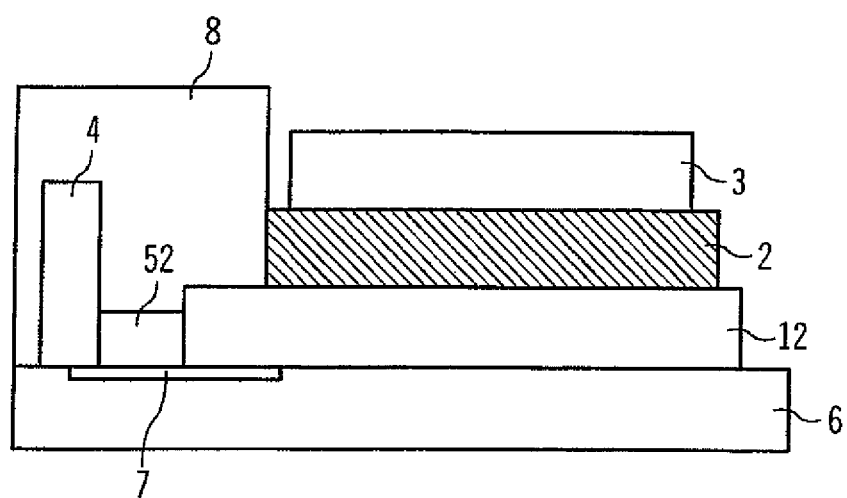
FIG. 3 shows schematic sectional representations of an optoelectronic component according to a further exemplary embodiment.

FIG. 3 is a schematic sectional representation of an optoelectronic component according to a further exemplary embodiment. In this case the optoelectronic component may be constructed as in the exemplary embodiments according to FIG. 1A or 2.

The substrate 6 of the optoelectronic component shown here comprises a cavity 7, over which one electrical connection 52 of a plurality of electrical connections is arranged. Furthermore, the optoelectronic component comprises a insulator layer 8, which is applied to the electrical connection 52. In this case, the cavity 7 is arranged as a recess in the substrate 6 adjacent to the electrical connections 52.

The cavity may be formed continuously in the substrate as a reservoir for the melting material from all the plurality of electrical connections 5. Alternatively, one cavity 7 may in each case also be formed for each of the electrical connections 5 in the substrate 6 adjacent to the respective electrical connection 5.

As features of the optoelectronic component, the cavity 7 and the insulator layer 8 may also be used in each case by themselves in an optoelectronic component.

In addition, the insulator layer 8 also surrounds the power supply 4. In the case of an optoelectronic component configured in this way, if a short circuit is present between the segment 12 of the first electrode layer 1 and the second electrode layer 3, the melting material of the electrical connection 52 may be collected by the cavity 7, which preferably takes the form of a reservoir. Likewise melting material from the insulator layer 8 may then advance into the space freed up by the electrical connection 52. In the cavity 7 mixing of the material of the electrical connection 52 and of the insulator material 8 may initially occur.

As a consequence of the fact that the volume of insulator material outweighs that of the material of the electrical connection 52, the material of the electrical connection 52 may be saturated by the continued flow of material from the insulator layer 8. As a consequence of saturation of the material of the electrical connection 52 by the insulator material 8, the insulator material 8 may overlay the material of the electrical connection 52, which constitutes the insulating effect of the insulator layer 8 to be achieved relative to the electrical connection 52.

Figure 4A:
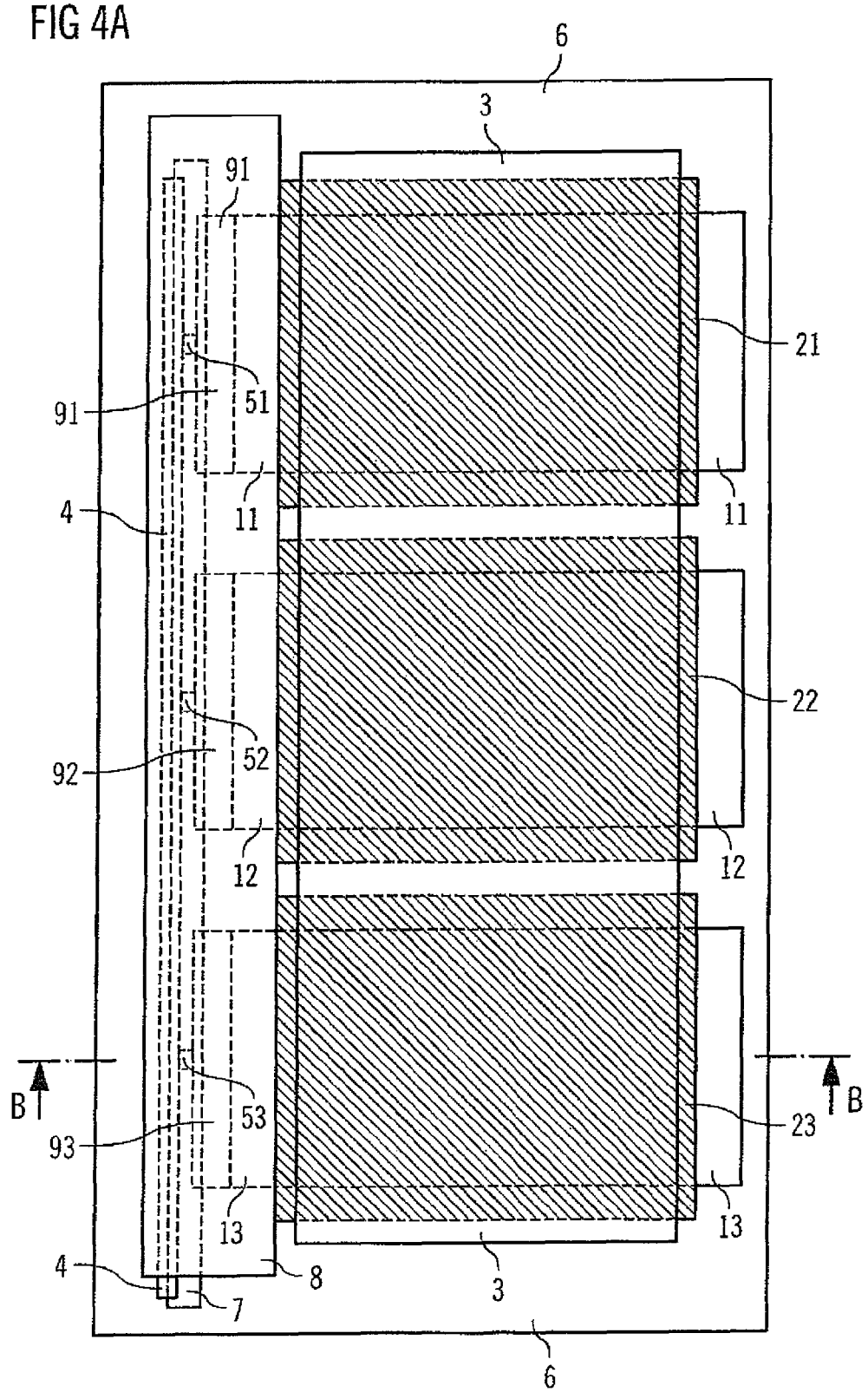
FIGS. 4A and 4B are schematic representations of an optoelectronic component according to a further exemplary embodiment in plan view (FIG. 4A) and in sectional representation (FIG. 4B)

FIG. 4A is a schematic representation in plan view of an optoelectronic component according to a further exemplary embodiment.

The optoelectronic component here comprises a current spreading layer 91, 92, 93, which is arranged between in each case one electrical connection 51, 52, 53 and in each case one segment of the first electrode layer 11, 12, 13 and is likewise surrounded by the insulator layer 8. The current spreading layer 91, 92, 93 may also be widened for current spreading, in order to improve the power supply to the segments of the first electrode layer 11, 12, 13.

Furthermore, the optoelectronic component comprises a cavity 7, which is arranged adjacent the electrical connections 51, 52, 53 as a recess in the substrate 6 and formed continuously in the substrate as a reservoir for the melting material from all of the plurality of electrical connections 51, 52, 53. Alternatively, one cavity 7 may in each case also be formed in the substrate 6 for each of the electrical connections 51, 52, 53 adjacent to the respective electrical connection 51, 52, 53.

Figure 4B:
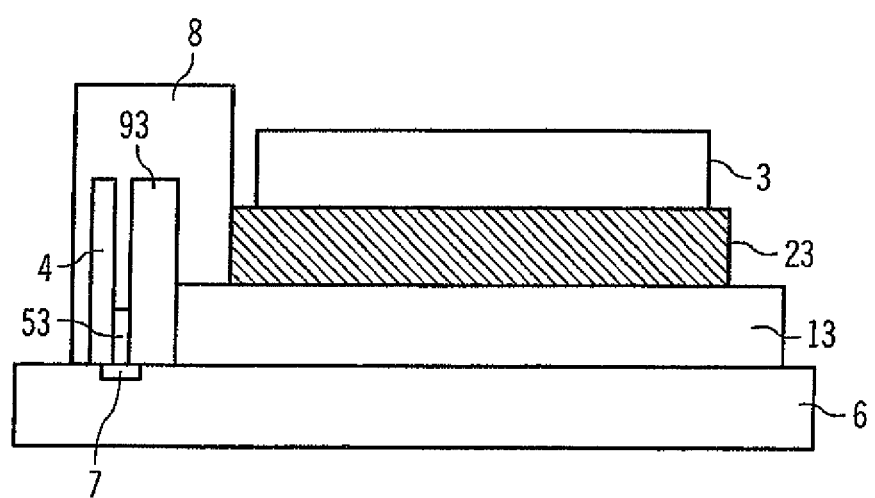

FIG. 4B shows a schematic sectional representation of the optoelectronic component of FIG. 4A in the section plane labelled BB in FIG. 4A.

The current spreading layer 93 is arranged between the first electrode layer 13 and the electrical connection 53. As FIG. 4B shows, the cavity 7 in the substrate 6 may also extend beyond the region of the electrical connection 53. In this case, both the horizontal and the vertical extent of the cavity 7 in the substrate 6 is dependent on the quantity of melting material from the electrical connection 5 and the insulator layer 8 to be accommodated.

Moreover, as shown in FIG. 4A, a continuous cavity 7 may be formed in the substrate 6 as a reservoir for the meltable material from all the plurality of electrical connections 51, 52, 53. Alternatively, one cavity 7 may in each case also be formed in the substrate 6 for each of the electrical connections 51, 52, 53 adjacent to the respective electrical connection 51, 52, 53.

As features of the optoelectronic component, the cavity 7, the insulator layer 8 and the current spreading layer 9 may also be used by themselves in in each case one optoelectronic component.

Figure 5:
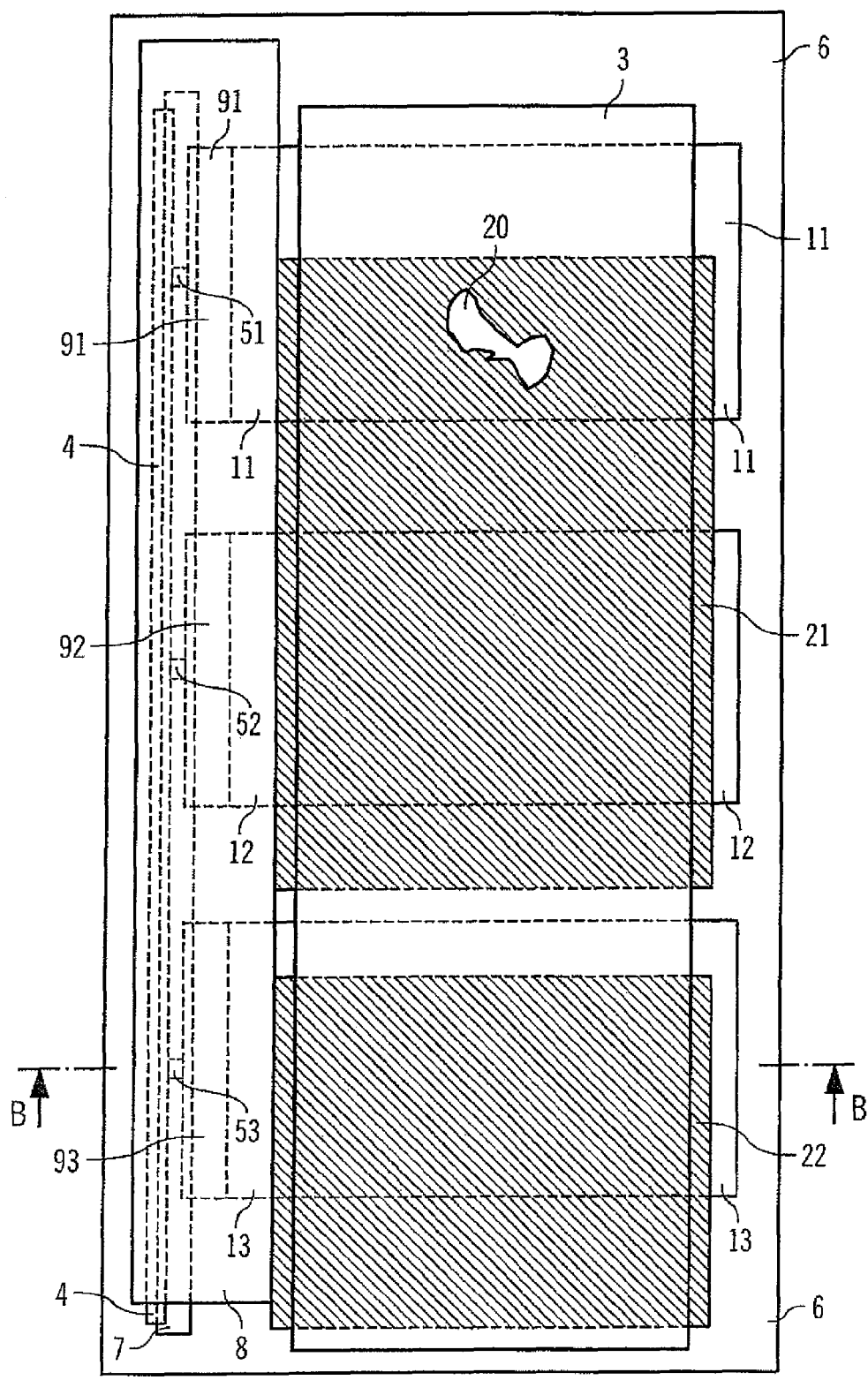
FIGS. 5 to 7 are schematic representations of optoelectronic components according to further exemplary embodiments.

FIG. 5 shows a schematic representation, in plan view, of an optoelectronic component according to a further exemplary embodiment. In the exemplary embodiment, which shows the arrangement of two segments 21, 22 of the organic functional layer 2 over three segments 11, 12, 13 of the first electrode layer 1, the two segments 21, 22 of the organic functional layer 2 are displaced due to the typical inaccuracy of the shadow masking method currently available.

In the conventional method of structured application of organic functional layers using the shadow masking method, the segments 21, 22 of the organic functional layer 2 are applied for safety reasons at a distance of at least 200 μm relative to one another. This corresponds to the maximum inaccuracy of the current masking method, whereby the light-emitting area drops to below 80% of the total area. As a result of the segments 11, 12, 13 of the first electrode layer 1 and the arrangement of the plurality of electrical connections 51, 52, 53, the distance may be selected to be smaller and thus a larger light-emitting area may be achieved, whereby such production defects may be compensated.

In addition, the segment 21 of the organic functional layer 2, purely by way of example, comprises a defect 20 in the region of the segment 11 of the first electrode layer 1, which defect leads, due to a short circuit, to melting of the electrical connection 51 and to insulation of the defective segment 11 from the remainder of the circuit. Furthermore, further power supply to the segment 21 is ensured by the electrical connection 52 and by the segment 12 of the first electrode layer 1, wherein due to the low transverse conductivity of the organic functional layer 21 virtually no more current can flow through the defect 20. Although the emission of electromagnetic radiation by the segment 21 is reduced, total failure of the optoelectronic component in the case of such a short circuit may be effectively prevented by the plurality of electrical connections 51, 52, 53.

Figure 6:
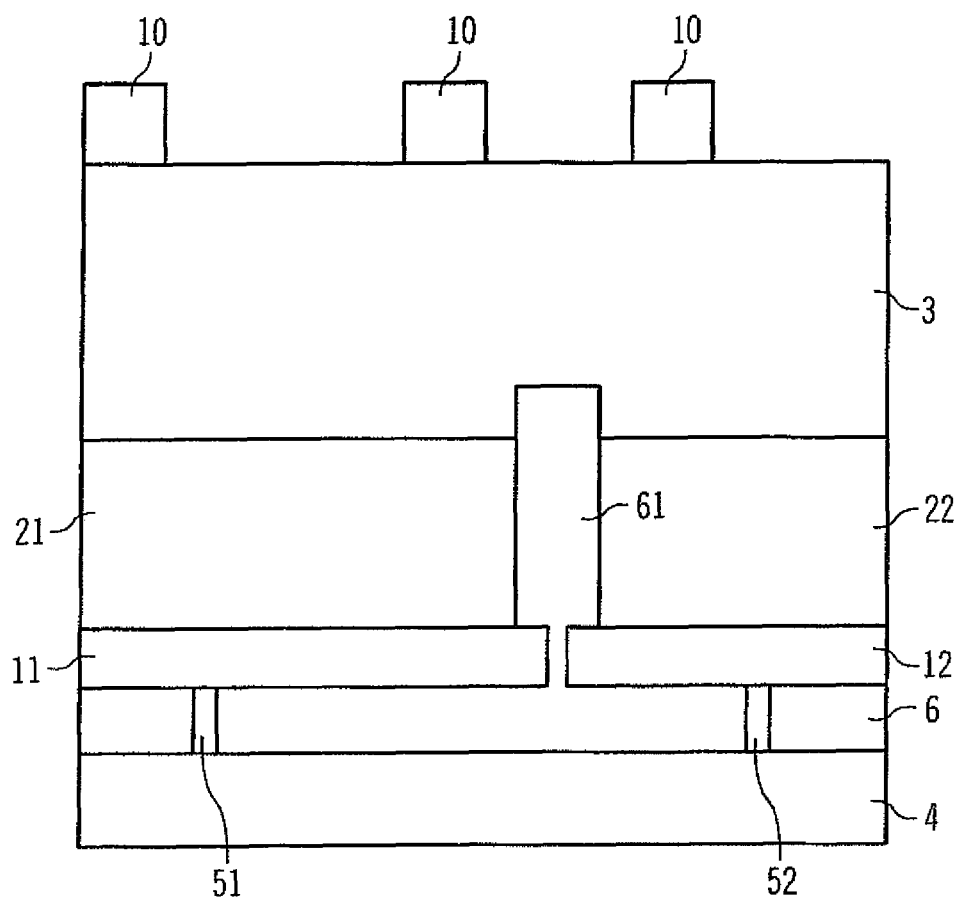

FIG. 6 is a schematic sectional representation of an optoelectronic component according to a further exemplary embodiment.

A power supply 4 is here arranged on one main surface of a substrate 6. Alternatively, the power supply 4 may also take the form of a non-transparent, i.e. opaque, conductive substrate. Electrical connections 51, 52 are arranged over the power supply 4. The electrical connections 51, 52 arranged on the power supply 4 are formed in orifices 511, 512 in the substrate 6, which take the form of vias, and in each case contact one of the segments 11, 12 of the first electrode layer 1. The segments 11, 12 of the first electrode layer 1 are arranged on a first main surface of the substrate 6, while the power supply 4 is arranged on a second main surface of the substrate 6, wherein the first and second main surfaces of the substrate 6 are different from one another and face away from one another. In the event of the power supply 4 taking the form of a substrate, the electrical connections 51, 52 may alternatively also be formed in an insulator layer 8 instead of in the substrate 6.

The electrical connections 51, 52 may moreover be made from a readily melting, conductive material and are meltable in the case of exposure to high temperatures, such as for example a short circuit. The electrical connections 51, 52 may be applied by a standard lithographic process.

The segments 11, 12 of the first electrode layer 1 are applied in structured manner to the electrical connections 51, 52 for example by soft sputtering or vapour deposition. In addition, a current spreading layer may be applied between the electrical connections 51, 52 and the segments 11, 12 of the first electrode layer 1.

An organic functional layer 2 is applied to the first electrode layer 1. As shown in FIG. 6, the first electrode layer 1 and the organic functional layer 2 are arranged in segments 11, 12, or 21, 22. Segmentation of the first electrode layer 1, the organic functional layer 2, and the current spreading layer 9 is achieved by an extension 61 of the substrate 6, which extends through the first electrode layer 1 and the organic functional layer 2.

In addition, a second electrode 3 is applied on the organic functional layer 2, which second electrode is advantageously formed for light emission from a transparent material in a top emitter configuration. On the second electrode layer 3 upper contacts 10 are additionally arranged in structured manner for current conduction, which may for example serve as contacts for a bonding wire.

Figure 7:
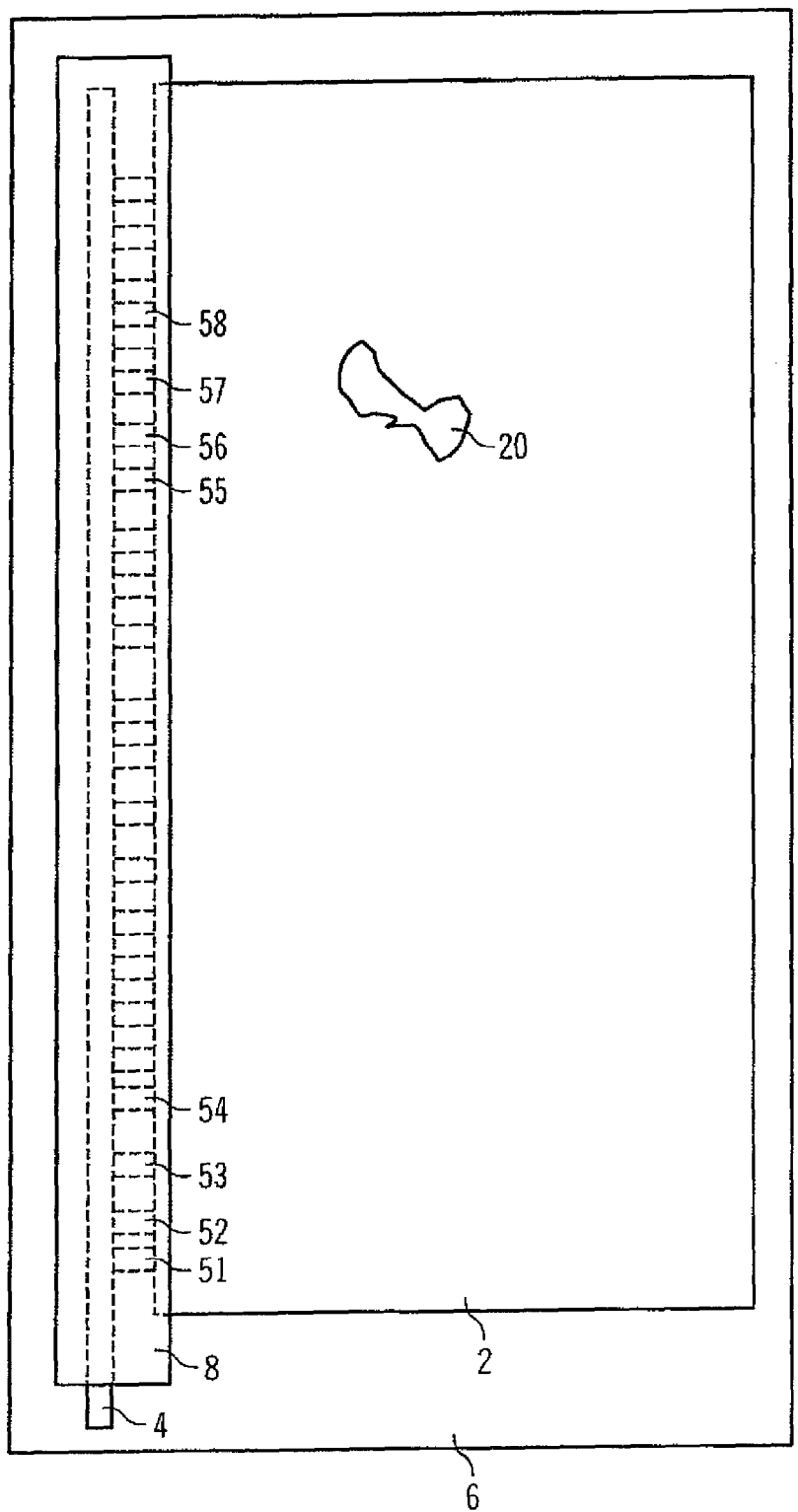

FIG. 7 shows a schematic representation, in plan view, of an optoelectronic component according to a further exemplary embodiment, with an organic functional layer 2 applied over the entire surface, which layer is arranged on a plurality of segments of the first electrode layer 1 (not shown).

The plurality of segments of the first electrode layer 1 is here contacted by a plurality of electrical connections, wherein electrical connections are labelled 51, 52, 53, 54, 55,

56, 57, 58 by way of example. In this case, in the exemplary embodiment shown precisely one segment of the first electrode layer 1 is assigned to each of the plurality of electrical connections, such that the first electrode layer 1 comprises precisely the same number of segments as there are electrical connections.

As an alternative, one segment of the first electrode layer 1 may also be assigned in each case to a plurality of electrical connections, for instance two, three or more adjacent electrical connections. This may mean that the segments of the first electrode layer 1 are in each case connected electrically conductively to the power supply 4 by way of a plurality of electrical connections.

In the case of a short circuit due to a defect 20 in the organic functional layer 2, the power will flow as a power loss due to the low resistance through that electrical connection 56 and the segment of the first electrode layer 1 electrically conductive with the electrical connection 56 which is closest to the short circuit. This electrical connection 56 will melt and form an infinitely high resistance. The adjacent electrical connection 55 is loaded with a markedly lower current than the first electrical connection 56 to have melted, due to the low transverse conductivity of the organic functional layer 2 and the elevated resistance associated therewith.

Nonetheless, the current density at the adjacent electrical connection may still be so great that the adjacent electrical connection 55 also melts. The electrical connections 57, 58 adjacent to the defect 20 will continue to melt until the resistance in the organic functional layer 2 is so great, due to the low transverse conductivity, that the further electrical connections no longer melt.

Current may continue to flow through the electrical connections 51, 52, 53, 54 which are not directly affected by the short circuit caused by the defect 20. Since the horizontal extent of the organic functional layer 2 is greater than its layer thickness, the electrical resistance through the organic functional layer 2 perpendicular to the extension plane of the functional layer 2 is lower than the electrical resistance along the extension plane, i.e. lower than the transverse conduction resistance.

It is thus possible for just a very few electrical connections 55, 56, 57, 58 to melt and for no radiation to be emitted in just a small area of the optoelectronic component, while the remainder of the optoelectronic component continues to remain functional due to the segmentation of the first electrode layer 1.

The exemplary embodiments and features shown in FIGS. 1A to 7 may be varied at will.

The description made with reference to exemplary embodiments does not restrict the invention to these embodiments. Rather, the invention encompasses any novel feature and any combination of features, including in particular any combination of features in the claims, even if the claims or exemplary embodiments do not explicitly mention these features themselves or this combination of features itself.

The invention claimed is:

1. An optoelectronic component with short circuit protection, comprising:
    a first electrode layer with a plurality of segments, which are arranged separately from one another;
    a functional layer on the first electrode layer, which emits electromagnetic radiation when in operation;
    a second electrode layer on the functional layer;
    a power supply; and
    a plurality of electrical connections,
    wherein at least one of the plurality of electrical connections is arranged between the first power supply and at least one of the plurality of segments of the first electrode layer for electrical contacting of the first electrode layer,
    wherein the optoelectronic component comprises a substrate having a main surface on which the power supply, the plurality of electrical connections and the plurality of segments of the first electrode layer, the functional layer and the second electrode layer are arranged,
    wherein in the substrate adjacent to at least one of the plurality of electrical connections a cavity is arranged,
    wherein the cavity is configured to receive melting material from the at least one of the plurality of electrical connections,
    wherein the power supply has a first cross-section and each of the plurality of electrical connections has a second cross-section,
    wherein the second cross-section is smaller than the first cross-section, and
    wherein the plurality of electrical connections take the form of fuses.

2. The optoelectronic component according to claim 1, wherein the second cross-section is reduced at least by a factor of 10 in comparison with the first cross-section.

3. The optoelectronic component according to claim 1, wherein the power supply and the plurality of electrical connections are of one-piece construction or the power supply and the plurality of electrical connections are made from different materials.

4. The optoelectronic component according to claim 1, wherein the electrical connections extend through the substrate.

5. The optoelectronic component according to claim 4, wherein the substrate comprises a plurality of orifices, wherein one of the plurality of electrical connections is arranged in each of the plurality of orifices.

6. The optoelectronic component according to claim 1, further comprising an insulator layer made from a meltable and/or pourable material, on at least one of the plurality of electrical connections.

7. The optoelectronic component according to claim 6, wherein the at least one of the plurality of electrical connections is such that, in the case of a short circuit, the at least one of the plurality of electrical connections melts, and
    wherein the insulator layer is suited to insulating at least one of the plurality of electrical connections.

8. The optoelectronic component according to claim 1, wherein the functional layer comprises inorganic or organic materials.

9. The optoelectronic component according to claim 1, wherein the functional layer comprises at least two segments, which are arranged separately from one another, and
    wherein one segment of the functional layer is arranged on at least one of the plurality of segments of the first electrode layer.

10. The optoelectronic component according to claim 1, wherein the functional layer is arranged continuously over at least two of the plurality of segments of the first electrode layer.

11. The optoelectronic according to claim 1, wherein the at least two of the plurality of segments of the first electrode layer are connected parallel to one another.

12. The optoelectronic component according to claim 1, further comprising at least one current spreading layer, which is arranged between at least one of the plurality of electrical connections and at least one of the plurality of segments of the first electrode layer.

13. The optoelectronic component according to claim 1, wherein the second electrode layer comprises at least two segments, and wherein one of the at least two segments is arranged over at least one of the plurality of segments of the first electrode layer.

14. The optoelectronic component according to claim 1, wherein the second electrode layer is arranged continuously over at least two of the plurality of segments of the first electrode layer.

15. The optoelectronic component according to claim 6, wherein the insulator layer is made from a meltable and/or pourable material.

\* \* \* \* \*

UNITED STATES PATENT AND TRADEMARK OFFICE
CERTIFICATE OF CORRECTION

PATENT NO. : 8,653,509 B2
APPLICATION NO. : 12/921313
DATED : February 18, 2014
INVENTOR(S) : Michael Popp It is certified that error appears in the above-identified patent and that said Letters Patent is hereby corrected as shown below:

In the Claims

Col. 14, line 60, after "optoelectronic" and before "according", insert --component--.

Signed and Sealed this
Twelfth Day of August, 2014

Michelle K. Lee
*Deputy Director of the United States Patent and Trademark Office*